United States Patent [19]

Dunfield et al.

[11] Patent Number: 4,793,897
[45] Date of Patent: Dec. 27, 1988

[54] SELECTIVE THIN FILM ETCH PROCESS

[75] Inventors: John S. Dunfield, San Jose; Bradley J. Taylor, Saratoga, both of Calif.

[73] Assignee: Applied Materials, Inc., Santa Clara, Calif.

[21] Appl. No.: 28,242

[22] Filed: Mar. 20, 1987

[51] Int. Cl.$^4$ .................. B44C 1/22; C03C 15/00; C03C 25/06
[52] U.S. Cl. .................. 156/643; 156/646; 156/653; 156/657; 156/659.1; 204/192.37; 252/79.1
[58] Field of Search .............. 156/643, 646, 653, 657, 156/659.1, 662; 252/79.1; 204/192.32, 192.37; 427/38, 39

[56] References Cited

U.S. PATENT DOCUMENTS 4,303,467 12/1981 Scornavacca et al. ....... 252/179.1 X
4,568,410 2/1986 Thornquist .................... 252/79.1 X
4,668,365 5/1987 Foster et al. .................... 204/192.23

Primary Examiner—William A. Powell
Attorney, Agent, or Firm—Flehr, Hohbach, Test, Albritton & Herbert

[57] ABSTRACT

A plasma process using a reactant gas mixture of fluorinated etching gas and oxygen for selectively etching a thin film of material such as silicon nitride with high selectivity for a silicon oxide underlayer and, preferably, for a photoresist overlayer mask.

30 Claims, 2 Drawing Sheets

SELECTIVE THIN FILM ETCH PROCESS

BACKGROUND OF THE INVENTION

The present invention relates to the selective, preferably anisotropic, etching of films such as silicon nitride, formed over silicon dioxide. In particular, our invention relates to a process for etching silicon nitride anisotropically with high selectivity to the underlying silicon dioxide and with a controlled silicon nitride profile and controlled silicon dioxide loss or gain.

The composite silicon nitride-over-silicon oxide has a number of applications in integrated circuits. For example, nitride-over-oxide may be used as an oxidation mask to selectively expose field areas of IC (integrated circuit) wafers during LOCOS formation of the field isolation oxide. In such applications, the underlying oxide may be very thin. During the patterning of the silicon nitride LOCOS mask, it is necessary to precisely replicate the lithographic mask, such a photoresist, in the silicon nitride without dimensional loss, with good resolution and without etching of (i.e., with suitably high selectivity for) the overlying photoresist mask and the underlying thin oxide. When the nitride is removed subsequently from the active areas, selectivity for photoresist is not a concern, because the photoresist is stripped prior to the LOCOS oxidation. However, preventing degradation or removal of the thin oxide is still very much a concern.

Fluorocarbon etchants such a $CH_3F$ and $CH_2F_2$ and $SF_6$ and $NF_3$ have been used to etch silicon nitride. Flurocarbon etchants may form non-volatile carbon-containing organic polymers which deposit on the oxide and, therefore, increase the etch selectivity. However, carbon forms particulates and, thus, results in an undesirably dirty process, particularly for LSI (large scale integration) and VLSI (very large scale integration) circuits, which are susceptible to even a relatively few very small particulates. In addition, organic polymer layers may deposit, sometimes indiscriminately, within the reactor, necessitating relatively frequent cleaning of the reactor.

SUMMARY OF THE INVENTION

It is a primary object of the present invention to selectively etch a thin film such as silicon nitride formed on a silicon dioxide underlayer.

It is a related objective to provide a process which achieves selective anisotropic etching of silicon nitride-over-silicon dioxide with a resulting controlled anisotropic nitride etch profile and controlled selectivity (either gain or loss) for the underlying oxide.

It is another related object to provide such a process which also achieves controlled selectivity for photoresist masks. The above and other objectives are achieved using an $SiF_4$ and $O_2$ based reactant gas flow which etches silicon nitride and selectively deposits oxide, thereby compensating for the inherent etching of oxide underlayers by the fluorine species. To our knowledge, $SiF_4$ and $O_2$ have been used to deposit silicon oxide, but not to etch thin fims such as nitride and not to etch films with controlled deposition on an underlayer.

In one aspect, our process is adapted to selectively (and anisotropically) etch a silicon nitride layer constituent of a body comprising a silicon nitride layer formed over a silicon oxide underlayer, with controlled selectivity for the silicon oxide underlayer, and comprises exposing the body to a plasma formed from a reactant gas flow of $SiF_4$ and oxygen.

In another related aspect, ours is a process for etching a silicon nitride layer constituent of a body comprising a layer of silicon nitride over a silicon oxide underlayer, with controlled high selectivity for the silicon oxide underlayer, using a photoresist etch mask formed over the silicon nitride, in a plasma etching chamber, comprising: positioning the masked body in the etch chamber; and communicating into the chamber a selectedd reactive gas mixture comprising $NF_3$, $SiF_4$, and $O_2$ for etching the silicon nitride with a high selectivity for the photoresist and for the oxide underlayer.

DETAILED DESCRIPTION OF THE INVENTION

1. Overall Process

Our invention uses oxygen-containing fluorinated gas chemistry in a vacuum plasma reactor to etch silicon nitride with controlled anisotropy, accompanied by high selectivity to organic photoresist masks and controlled selectivity to oxide. This controlled silicon nitride etch is a simple, one-step process, which increases repeatability, decreases material costs and enhances operator control. In addition, the increased selectivity to the oxide underlayer increases process yields and makes it easier to adapt the process to other applications.

The preferred reactive gas chemistry comprises $O_2/SiF_4$ and, more particularly, $NF_3/O_2/SiF_4$. $SiF_4$ is the selectivity and nitride etch agent (see Reaction A). $NF_3$ can be the main nitride etchant (see Reaction B). The $O_2$ combines with silicon from the $SiF_4$ to selectively form a silicon oxide-containing deposit on the oxide underlayer and, thus, increase the selectivity for oxide layers (see Reaction A). For example, typically, increasing the number of silicon nitride-containing wafers decreases the nitride etch rate, but increasing the $NF_3$ flow rate thus compensates for the increased number of wafers, by increasing the nitride etch rate, even where other parameters are maintained constant. The addition of $NF_3$ increases the usable range of the process, i.e., the process window.

2. Process Trends/Trend Lines

Figure 1:
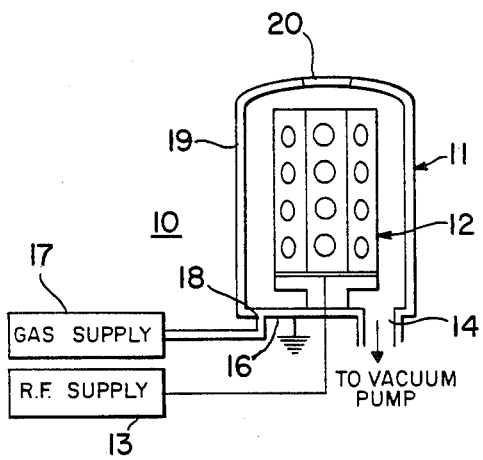
FIG. 1 is a schematic illustration of a suitable plasma etching system for practicing the present process.

The versatility and advantages of our present process is demonstrated by the ability to use the selected process gases to tailor the etch selectivity for photoresist etch masks and to control the rate of deposition of the silicon oxide-containing compounds and thereby control the loss (or gain) of oxide during the process by changing the flow rate and flow rate ratios of the three main gaseous reactants $NF_3$, $O_2$ and $SiF_4$. These results are achieved using a standard, unaltered reactor 10, FIG. 1. The effects of the selected process gases are summarized below.

The applicable equilibrium reactions for the $SiF_4$, $NF_3$ and $O_2$ are:

Reaction A: $SiF_4 + O_2 \rightleftharpoons SiO_2 + 4\dot{F}$

Reaction B: $2NF_3 \rightleftharpoons N_2 + 6\dot{F}$

Reaction A dominates the selectivity mechanism, because the $SiO_2$ is deposited and the fluorine is a nitride etchant. As shown in Reaction B, the fluorine increases the nitride etch rate.

The nitride etch rate is directly proportional to the flow rate of the $SiF_4$, which is used here as the main nitride etchant.

Figure 2:
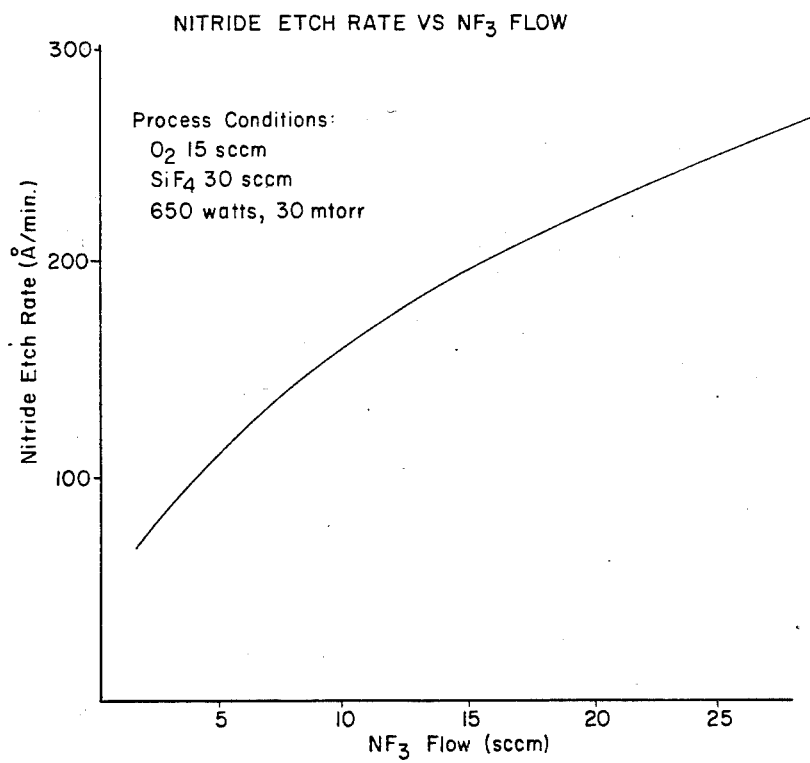
FIGS. 2-5 depict trend lines showing the effect of the various gases on oxide and nitride each rates.
Figure 3:
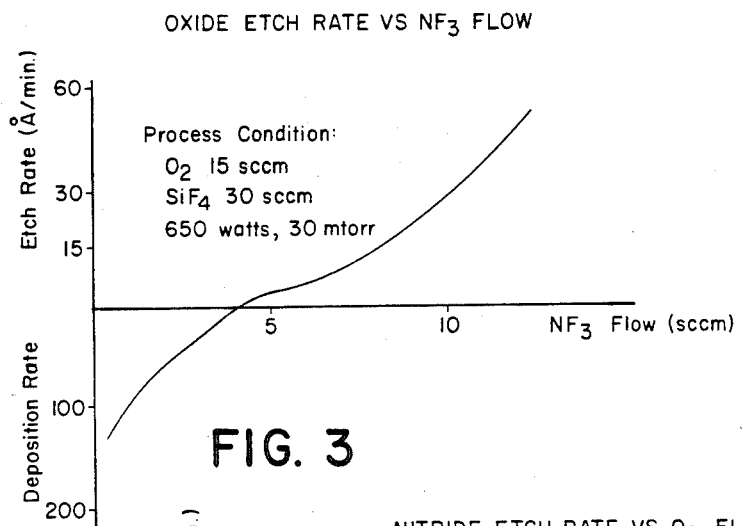

As mentioned above and as depicted in FIGS. 2 and 3, increasing the flow rate of $NF_3$ increases both the nitride etch rate and the oxide loss.

The oxide etch rate is affected by the photoresist coverage on the wafer. Specifically, the oxide etch rate is inversely proportional to the area of the wafer covered by the photoresist at fixed process conditions. Decreasing/increasing the photoresist coverage increases/decreases the oxide loss during etching. The photoresist acts as an oxygen getter which slows down or prohibits the formation of and the deposition of $SiO_x$, which is the key factor in controlling oxide loss or gain and selectivity. However, as discussed below, an IC design and associated nitride etching step which require a large area photoresist coverage can be compensated for by increasing the oxygen flow rate.

Figure 4:
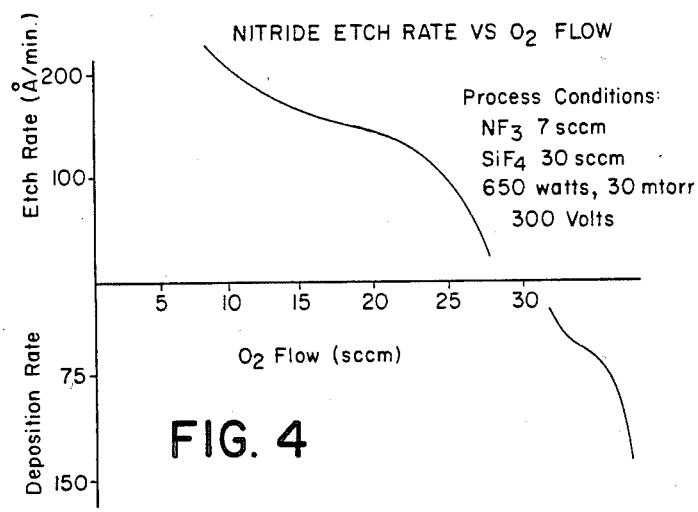
Figure 5:
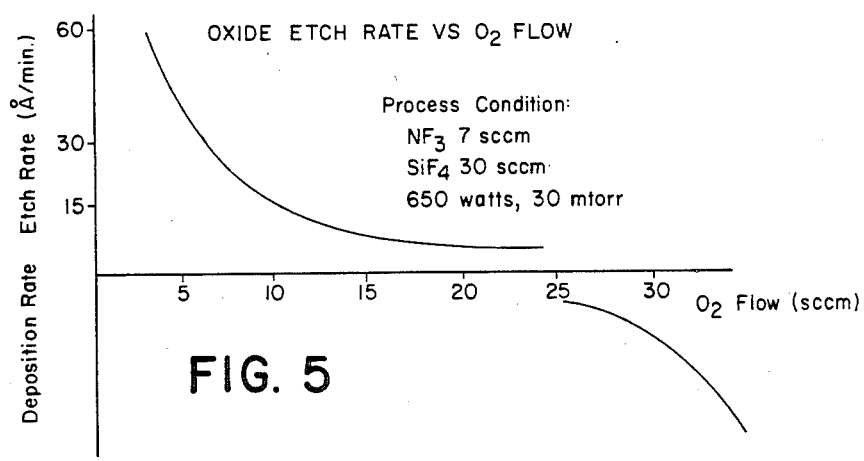

As mentioned previously, the oxide etch/deposition rate is affected and controllable by changing the percent of oxygen in the total gas flow. In fact, as shown in FIGS. 4 and 5, both the nitride etch rate and the oxide etch rate are inversely proportional to the oxygen proportion of the total flow. However, the responses of the oxide and nitride etch rates are different as the oxygen flow rate is increased and this is responsible for our ability to exploit the selectivity mechanism. Moreover, the addition of $NF_3$ contributes to the control of the selectivity mechanism. Referring further to FIG. 4, decreasing/increasing the flow rate of the oxygen relative to the other gases also decreases/increases the selected deposition of $SiO_x$, typically $SiO_2$, on the oxide and consequently increases/decreases the oxide loss during etching. See Reaction A. Increasing the flow rate of oxygen can increase the silicon oxide deposition rates sufficiently to provie infinite selectivity to oxide (zero etch rate) and, in fact, to provide net oxide deposition or gain rather than loss. In effect, varying the oxygen flow rate ratio permits the selection of oxide etch/deposition from a continuum of rates, that is, from high etch rates at one end of the spectrum, to zero etch/deposition, to deposition. Furthermore, our understanding of the different effects of photoresist coverage and oxide flow on the oxide etch/deposition rates has made it possible to obtain the low oxide etch rates and high selectivity to different photoresist coverage by adjusting the $O_2$ flow rate. That is, large area photoresist coverage can be compensated by increasing the oxygen flow.

$SiF_4$ is an etchant (the nitride etch rate is proportional to the $SiF_4$ flow). In addition, the effect of $SiF_4$ flow on oxide etch/deposition is similar to that of oxygen flow in that the oxide (specifically $SiO_2$) etch rate is inversely proportional to the $SiF_4$ flow. Decreasing/increasing the flow rate of the $SiF_4$ increases/decreases the oxide loss.

3. Examples and Applications

The tables listed below summarize optimum values and ranges of preferred and useful values of parameters for etching silicon nitride over silicon dioxide using the AME 8110 low pressure ion-assisted plasma reactor. This reactor is available from Applied Materials, Inc., Santa Clara, Calif. The AME 8110 and, more generally, the 8100 series of low pressure reactive ion etching (RIE) mode plasma etching reactors, are schematically illustrated as system 10 in FIG. 1. The RIE system 10 includes a cylindrical reaction chamber 11 and a hexagonal cathode 12 which illustratively holds twenty-four wafers, four to a facet, and is connected to an RF power supply 13. An exhaust port 14 communicates between the interior of the reaction chamber 11 and a vacuum pump. The walls of the reaction chamber 11 and the base plate 16 form the grounded anode of the system. A supply of reactive gas from gas supply 17 is communicated to the interior of the chamber 11 through an entrance port 18 and through a conduit arrangement 19 to a gas distribution ring 20 at the top of the chamber.

The geometry of the reactor system 10 is asymmetric. That is, the anode-to-cathode ratio is slightly greater than 2-to-1, resulting in high energy bombardment of the cathode surface 12 relative to the anode surface 11. Such a design provides lower power density and bettern etch uniformity, decreases contamination from the chamber walls and facilitates achievement of etch anisotropy. In addition, the cathode structure configuration allows all twenty-four wafers to be vertically oriented during the process to minimize wafer exposure to particulates.

In such RIE mode systems, a highly directional mechanical ion bombardment etch component dominates the more isotropic chemical component and imparts high anisotropy to the etching characteristics of the system. Consequently, RIE mode systems are preferred for the etching fabrication steps of highly dense, small feature size IC applications such as LSI and VLSI circuits. However, the use of the AME 8110 etcher and 8100 series etchers are to be considered illustrative only. The process also has been used successfully in the 8300 series etchers, which also are available from Applied Materials, Inc. of Santa Clara, Calif. More generally, the present process is primarily chemically driven and, thus, should apply to all plasma state etching systems capable of handling the prescribed gases.

The three tables describe three increasingly specific useful ranges of process parameters for etching silicon nitride without damaging the oxide underlayer. That is, Table 1 describes a range of parameters which are expected to provide useful results based upon the data reflected in Tables 2 and 3. Moreover, because this process is chemically driven, it will have applicability to any plasma type system and, e.g., to a much broader range of pressures than are specified in the tables. Table 2 describes a narrower and, thus, more specific set of process parameter ranges which provide a more optimum combination of high silicon nitride etch rate, high selectivity for photoresist and high selectivity for oxide underlayers. Table 3 lists a specific narrow set of process parameters which are presently preferred in that they provide a combination of high nitride etch rates, adequate selectivity for photoresist and very high selectivity for oxide underlayers for a full load of twenty-four, six-inch wafers.

| Process Parameters | Etch Parameters Silicon Nitride/$SiO_2$ | | |
|---|---|---|---|
| | 1. Useful Range | 2. Preferred Range | 3. Optimum Value |
| Total Gas Flow, sccm | 10–400 | 50–100 | 78 |
| $NF_3$ | 0–100 | 0–50 | 13 |
| $SiF_4$ | 0–100 | 10–50 | 30 |

| Process Parameters | Etch Parameters Silicon Nitride/SiO$_2$ | | |
|---|---|---|---|
| | 1. Useful Range | 2. Preferred Range | 3. Optimum Value |
| O$_2$ | 0–100 | 10–50 | 15 |
| He | 0–100 | 20–50 | 20 |
| Chamber Pressure, mT | 10–150 | 20–50 | 30 |
| Residence Time (sec.) | 0.5–30 | 5–15 | ~9 |
| Total Power Setting 8100 (w) | 100–1500 | 100–700 | 600 |
| Power Density (w/cm$^2$) | 0.05–0.80 | 0.05–0.17 | 0.15 |
| Etch Rate, Ang./min. | 0–500 | 100–200 | 150 |
| Selectivity for Photoresists (AZ 1470) | ≧0:5 | 1:1 | 1:1 |
| Selectivity for Underlayer: | | | |
| Composite (1) | >3:1 | >5:1 | 15:1 |
| Composite (2) | >5:1 | >10:1 | 25:1 |

(1): Thermal LPCVD Nitride/Thermal Oxide
(2): Plasma Nitride/Thermal Oxide

In general, the tables are self-explanatory. As a group and as indicated, they involve etching a layer of thermal LPCVD silicon nitride or plasma nitride of approximate thickness (low pressure chemical vapor deposition) 1000–3000 Angstroms formed over a thermally-grown silicon dioxide layer of thickness 80–1000 Angstroms, using an 0.6–1.5 microns thick AZ1470 organic photoresist mask.

Briefly, the exemplary etch process involves positioning one or more wafers containing the photoresist mask-/nitride/oxide composite on the facets within the 8110 etch system, and after standard cleaning, seasoning and calibrating steps, applying gas at the stated flow rates for the given residence time and using the given chamber pressure and power setting.

As indicated, the results are quite good. Selectivity for photoresist is ≧0:5, 1:1 and 1:1 for the broad, optimum and preferred full load ranges. The selectivity for the thermal oxide underlayer associated with the thermal LPCVD nitride is >3:1, >5:1 and about 15:1, respectively, for the three ranges. Also, the selectivity for the thermal oxide underlayer is >5:1, >10:1 and about 25:1, respectively, for the plasma nitride. Our process provides excellent linewidth control and a vertical nitride profile, minimizes linewidth loss, and minimizes bird's beak encroachment during LOCOS thermal oxidation, allowing better channel width definition for MOS devices. Overall uniformity is ±4 percent as compared to ±10 percent for prior practices using the 8110 with prior art high selectivity-to-oxide processes. In addition, because of the high selectivity and excellent unformity, the uniformity of the remaining thermal oxide is much better than that provided by prior art processes.

As indicated in Tables 2 and 3, the proper flow ratios of NF$_3$, O$_2$ and SiF$_4$ are very important in achieving and controlling high selectivity for oxide. Also, the pressure range is very important to controlling and maintaining anisotropy and critical dimensions. It is expected that a substantial increase in pressure in the AME 8110 reactor would decrease critical dimension control and, possibly, etch rate uniformity.

As indicated in the tables, an inert gas such as helium can be added to the NF$_3$/SiF$_4$/O$_2$ reactant gas composition, for the purpose of improving uniformity. Furthermore, inert gas such as helium or argon may be added in controlled amounts for the purpose of sputtering. In addition, past experience indicates that SF$_6$ could be substituted for NF$_3$, that is, to serve the same functions as the NF$_3$ (except that non-volatile sulfur may form on the surface). Also, Freon-containing gases defined by the family C$_n$H$_y$F$_x$X$_z$ could be added to increase the selectivity to the photoresist. CO or CO$_2$ might be substituted of oxygen (however, judicious selection is necessary to prevent adverse side effects such as forming organic deposits). Finally, but not exhaustively, the substitution of nitrogen-containing gases such as N$_2$ itself, NO$_2$ or N$_2$O may result in the deposition of silicon nitride and/or silicon oxynitrides on silicon, silicon nitride, silicon dioxide, polysilicon or metallic conductors such as aluminum or tungsten during etching or deposition.

In general, the above-described process can be adapted readily to etch films that form volatile products with fluorine chemistries, wherever high selectivity to underlying or masking silicon oxide is required. Thus, in addition to etching silicon nitride using SiF$_4$/O$_2$, NF$_3$/SiF$_4$/O$_2$ and NF$_3$/SiF$_4$/O$_2$/He, the process is readily adaptable to selectively etch both doped and undoped polysilicon formed over silicon dioxide underlayers using NF$_3$/SiF$_4$/O$_2$/C$_n$H$_y$F$_x$X$_z$ reactive gases; to selectively etch tungsten over silicon dioxide underlayers using NF$_3$/SiF$_4$/O$_2$/C$_n$H$_y$F$_x$X$_z$ reactive gases; and to selectively etch single crystal silicon, both doped and undoped, with high selectivity to underlying silicon dioxide and/or a silicon dioxide mask using NF$_3$/SiF$_4$/O$_2$. One such application is single crystal silicon trench etching. Also, it may be possible to extend the process to planar deposition of plasma silicon dioxides over polysilicon or aluminum lines using deposition and etch back. Planar deposition of silicon dioxide could be used for device passivation. The batch in-situ multi-step process capabilities of the AME 8100 and the AME 8300 reactive ion etch systems could be successfully applied to the present invention to manufacture one megabit and larger buried capacitor designs. Other applications include the isotropic removal of organic materials (such as photoresist and polyimides) for profile control using multi-step contouring approaches.

Having thus described preferred and alternative embodiments and applications of the present invention what is claimed is:

1. A process for etching a film with high selectivity relative to an underlying oxide layer or a masking oxide layer, comprising exposing the film to a plasma formed from a mixture of silicon-containing and fluorine-containing etchant-forming gas and oxygen-containing as, for etching the film and simultaneously depositing silicon oxide compounds on the underlayer or mask at a selected rate to offset inherent etching of the undrelayer or mask by said etchant component of said plasma.

2. The process of claim 1, wherein the thin film is silicon nitride and the reactant gas flow comprises SiF$_4$ and oxygen.

3. The process of claim 2, the silicon nitride layer having a photoresist mask formed thereon and the reactant gas flow further comprising NF$_3$.

4. The process of claim 2 or 3, the reactant gas flow further comprising an inert gas selected from argon and helium.

5. A process for selectively etching the silicon nitride layer constituent of a body comprising a layer of silicon nitride over a silicon oxide underlayer in a plasma etching chamber using a photoresist etch mask formed over the silicon nitride, with controlled high selectivity for the silicon oxide underlayer, comprising:

positioning the masked body in the etch chamber;

communicating into said chamber a reactive gas mixture comprising $NF_3$, $SiF_4$, and $O_2$ and energizing the reactive gas mixture to form a plasma for etching the silicon nitride with a high selectivity for the photoresist and for the oxide underlayer.

6. The process of claim 5, further comprising an inert gas selected from argon and helium.

7. The process of claim 5 or 6, the reactant gas flow comprising $NF_3/SiF_4/O_2/He$ at flow rate ratios of $\leq 100/\leq 100/\leq 100/\leq 100$.

8. The process of claim 5 or 6, the reactant gas flow comprising $NF_3/SiF_4/O_2/He$ at flow rate ratios of $\leq 50/10-50/10-50/20-50$.

9. The process of claim 5 or 6, the reactant gas flow comprising $NF_3/SiF_4/O_2/He$ at flow rate ratios of approximately 13/30/15/20.

10. A process for selectively etching a silicon nitride layer of a body which includes the silicon nitride layer over a silicon oxide underlayer with controlled selectivity for the silicon oxide underlayer, the nitride layer having a photoresist mask formed thereon, comprising: exposing the body to a plasma formed from a gas flow of $SiF_4$, oxygen and $NF_3$.

11. The process of claim 10, the reactant gas flow further comprising a freon-containing gas for increasing the selectivity for photoresist.

12. The process of claim 10, the reactant gas flow further comprising an inert gas selected from gases such as argon and helium.

13. A gas mixture for selectively etching silicon nitride with high selectivity for photoresist and silicon oxide, the mixture comprising $SiF_4$, oxygen and $NF_3$.

14. The gas mixture of claim 16, further comprising a freon-containing gas for increasing the selectivity for photoresist.

15. A plasma process for selectively etching a film selected from silicon and silicon nitride, with high selectivity to a film of silicon dioxide, comprising: exposing the film to a plasma formed from a gas mixture comprising (1) $SiF_4$; (2) fluorinated gas selected from $NF_3$ and $SF_6$; and (3) an oxygenated gas selected from oxygen, CO and $CO_2$ for etching the film and simultaneously depositing silicon oxide on the oxide layer at a selected rate to offset etching of oxide layer by etchant component of plasma.

16. The plasma process of claim 15, the reactant gas mixture further comprising a gas selected from argon and helium.

17. The plasma process of claim 16, wherein the reactant gas mixture further comprising $NF_3$, $SiF_4$, oxygen and helium.

18. The plasma process of claim 15 or 17, the reactant gas mixture further comprising a freon-containing gas for increasing selectivity for photoresist.

19. A gas mixture for etching silicon or silicon nitride with high selectivity to silicon dioxide, comprising (1) $SiF_4$; (2) fluorinated gas selected from $NF_3$ and $SF_6$; and (3) oxygenated gas selected from oxygen, CO and $CO_2$.

20. The gas mixture of claim 19, further comprising (4) gas selected from argon and helium.

21. The gas mixture of claim 19, the mixture comprising $NF_3$, $SiF_4$, oxygen and helium.

22. The gas mixture of claim 19 or 20, further comprising (5) a freon-containing gas for increasing selectivity to photoresist.

23. A plasma process for selectively etching a film selected from tungsten-containing films and polysilicon film with high selectivity to silicon oxide, comprising: exposing the film to a plasma formed from a gas flow comprising (1) $SiF_4$; (2) fluorinated gas selected from $NF_3$ and $SF_6$; (3) oxygenated gas selected from oxygen, CO and $CO_2$; and (4) freon-containing gas.

24. A gas mixture for selectively etching tungsten-containing layers and polysilicon-containing layers with high selectivity to silicon oxide, comprising: (1) $SiF_4$; (2) fluorinated gas selected from $NF_3$ and $SF_6$; (3) oxygenated gas selected from oxygen, CO and $CO_2$; and (4) freon-containing gas.

25. The gas mixture of claim 24, the mixture comprising $NF_3$, $SiF_4$, oxygen and a freon-containing gas.

26. A process for selectively etching in a reactor chamber the silicon nitride layer constituent of a body comprising a layer of silicon nitride and a layer of silicon oxide, comprising: generating in the reactor a plasma formed from a gas flow of oxygen and $SiF_4$ where the flow rate of oxygen is at least 15 percent of the $SiF_4$ flow rate for etching the silicon nitride and simultaneously depositing silicon oxide on the silicon oxide layer to suppress etching of the silicon oxide layer.

27. The process of claim 26, where the oxygen/$SiF_4$ flow rate ratio is approximately 50 percent.

28. The process of claim 26 or 27, wherein the flow rate ratio oxygen/$SiF_4$ is greater than about 1/1 for effecting net oxide deposition.

29. The process of claim 25, 26 or 27, wherein the gas further comprises $NF_3$ for increasing the etch selectivity of the nitride to the oxide.

30. The process of claim 25 or 26, wherein the nitride layer is masked with photoresist and the gas flow further comprises $NF_3$ for increasing the etch selectivity of the silicon nitride with respect to the photoresist and to the oxide.

* * * * *

UNITED STATES PATENT AND TRADEMARK OFFICE
CERTIFICATE OF CORRECTION

PATENT NO.   : 4,793,897
DATED        : December 27, 1988
INVENTOR(S)  : JOHN S. DUNFIELD ET AL It is certified that error appears in the above—identified patent and that said Letters Patent is hereby corrected as shown below:

In Claim 1, Col. 6, line 53, change "as," to --gas,--; and

In Claim 14, Col. 7, line 40, change "claim 16," to --claim 13,--.

Signed and Sealed this

Ninth Day of May, 1989

Attest:

DONALD J. QUIGG

*Attesting Officer*  *Commissioner of Patents and Trademarks*